United States Patent [19]
Crafts

[11] Patent Number: 5,896,331
[45] Date of Patent: Apr. 20, 1999

[54] REPROGRAMMABLE ADDRESSING PROCESS FOR EMBEDDED DRAM

[75] Inventor: Harold S. Crafts, Colorado Springs, Colo.

[73] Assignee: LSI Logic Corporation, Milpitas, Calif.

[21] Appl. No.: 08/997,366

[22] Filed: Dec. 23, 1997

[51] Int. Cl.$^6$ .................................................. G11C 7/00
[52] U.S. Cl. .................. 365/201; 365/230.06; 371/21.2; 371/21.6
[58] Field of Search ................................ 365/200, 201, 365/230.06, 189.07; 371/21.1, 21.2, 21.3, 21.6

[56] References Cited

U.S. PATENT DOCUMENTS

| | | | |
|---|---|---|---|
| 4,866,676 | 9/1989 | Crisp et al. | 365/200 |
| 5,208,778 | 5/1993 | Kumanoya | 365/201 |
| 5,231,319 | 7/1993 | Crafts et al. | 307/603 |
| 5,270,977 | 12/1993 | Iwamoto | 365/201 |
| 5,323,348 | 6/1994 | Mori et al. | 365/200 |
| 5,325,334 | 6/1994 | Roh et al. | 365/201 |
| 5,373,472 | 12/1994 | Ohsawa | 365/201 |
| 5,375,095 | 12/1994 | Yamada et al. | 365/230.03 |
| 5,386,386 | 1/1995 | Ogihara | 365/200 |
| 5,388,104 | 2/1995 | Shirotori et al. | 371/21.1 |
| 5,440,517 | 8/1995 | Morgan et al. | 365/202 |
| 5,471,482 | 11/1995 | Byers et al. | 371/21.2 |
| 5,502,675 | 3/1996 | Kohno et al. | 365/200 |
| 5,517,450 | 5/1996 | Ohsawa et al. | 365/200 |
| 5,577,004 | 11/1996 | Leshem | 365/230.03 |
| 5,623,640 | 4/1997 | Nakabo | 395/497.01 |
| 5,650,975 | 7/1997 | Hamade et al. | 365/230.01 |
| 5,668,755 | 9/1997 | Hidaka | 365/182 |
| 5,689,466 | 11/1997 | Qureshi | 365/201 |
| 5,694,355 | 12/1997 | Skjaveland et al. | 365/149 |
| 5,825,682 | 10/1998 | Fukui | 365/49 |

*Primary Examiner*—Son Mai
*Attorney, Agent, or Firm*—John R. Ley; Wayne P. Bailey

[57] ABSTRACT

A functional test on a memory array, formed by a plurality of embedded memory segments each with a reprogrammable address, is conducted by programming the same address into each segment and conducting a portion of the functional test while simultaneously addressing all of the segments using the same reprogrammed address. A test pattern of signals is written into the segments by using the same reprogrammed address, and then unique addresses are reprogrammed after writing the test pattern signals. The signals which were created by writing the test pattern are read by using the unique addresses. The functional test is simplified by using the same address to write the test pattern, rather than generating unique addresses to write the test pattern to all of the memory segments.

22 Claims, 4 Drawing Sheets

REPROGRAMMABLE ADDRESSING PROCESS FOR EMBEDDED DRAM

This invention generally relates to dynamic random access memory (DRAM) which is embedded in an integrated circuit (IC) such as an application specific integrated circuit (ASIC), a mixed signal ASIC or a system level integrated circuit (SLIC). More particularly, the present invention relates to new and improved embedded DRAMs for an IC which offer improved addressing capabilities for implementing redundancy through electrical rather than physical techniques and for configuring the embedded DRAM for use, particularly during testing.

CROSS REFERENCE TO RELATED INVENTION

This invention is related to inventions for a "Electrically Selectable Redundant Components for an Embedded DRAM" and "Reprogrammable Address Selector for Embedded DRAM," described in U.S. patent applications Ser. Nos. (96-087) and (97-110), respectively, filed concurrently therewith and assigned to the assignee hereof. The disclosures of these concurrently filed applications are incorporated herein by this reference.

BACKGROUND OF THE INVENTION

A DRAM is a memory element which holds and supplies information for use by electronic computing and logic elements, such as microcontrollers, microprocessors, logic arrays, and the like. An ASIC or a SLIC is a single IC which includes a combination of various electronic components, such as microcontrollers, microprocessors, logic gates, registers, amplifiers and the like, all of which have been selected, connected and integrated together to perform specific functions for a specific application. Examples of SLICs are controllers for computer memory disc drives, graphics controllers, LAN switches, fuel injector control systems for internal combustion engines, global positioning systems, and control devices for a wide variety of consumer products, among many other things. SLICs are desirable for use in mass produced products because of the enormous amount of functionality which can be created at a very low effective cost. These types of SLICs are sometimes referred to as a "system on a chip," because of the complete functionality obtained from the single chip or IC.

DRAMs have only recently been incorporated as part of SLICs. Previously, when the SLIC required memory to function, separate memories or DRAM chips were provided on a printed circuit board. Embedding DRAM in a SLIC avoids the additional cost of a separate memory chip. Avoiding the cost of the separate DRAM chip is attractive when the SLIC itself requires only a small amount of memory, because separate DRAM chips are relatively costly and of considerable memory size.

The typical semiconductor fabrication process almost always creates some number of defective chips, simply because of the complexity of the fabrication process and the large number of variables which must be precisely controlled during the process to obtain a fully functional chip. The number of fully functional chips created relative to the number of chips started or attempted is known as the "yield." If the yield is high, a lower effective cost per functional chip results, since the cost per chip is inversely proportional to the yield. Because of the highly competitive nature of semiconductor fabrication business, it is essential to obtain the highest possible yield to keep the individual costs of each functional chip as low as possible.

Fabrication of a SLIC with an embedded DRAM typically presents a much higher risk of defects and lower yields than the fabrication of a SLIC without an embedded DRAM. The DRAM is formed by tens or hundreds of thousands of repetitive and closely spaced components, resulting in a very high "density" of elements. High densities inherently create a greater possibility of defects arising during fabrication. Thus, embedding a DRAM in a SLIC simply raises the risk of reduced yields and a higher effective cost for each of the functional SLICs produced.

The embedded DRAM portion of the SLIC usually represents a relatively small portion of the overall size of the typical SLIC. If this were not the case, it would be more cost effective to use a separate DRAM chip in combination with the SLIC. The impact of a defect arising from a defective DRAM portion of the SLIC is therefore typically much greater than its contribution toward the size and cost of the complete SLIC. It is perhaps for these reasons and others that DRAMs have not been embedded in SLICs on a widespread and commercial basis.

In contrast, commercial DRAM chips are fabricated with special DRAM fabrication processes that have been specifically developed to address the unique fabrication requirements of DRAMs. These DRAM processes have evolved over many years to improve density and enhance yields. However, these special DRAM processes are not particularly attractive for use in fabricating SLICs with embedded DRAMs, because many of the other non-DRAM components of the SLIC do not require or respond favorably to such special DRAM fabrication process. Thus, the special DRAM fabrication process is usually unnecessary and potentially expensive when applied to the remainder of the SLIC. The relative size contribution of the embedded DRAM to the overall size of the SLIC often will not justify the use of a special DRAM fabrication process, even if the DRAM fabrication process could be favorably applied to the remaining elements of the SLIC. Furthermore, the influences from the other non-DRAM components of the SLIC, such as noise, may require DRAM circuit designs which are not optimal for response to such special DRAM fabrication processes.

In order to address the defect problem in fabricating semiconductor chips, it is typical to include redundant elements. Upon detecting a defective element by testing after fabrication, the defective element is bypassed and one of the redundant elements is substituted in its place. In this manner the chip can be salvaged and made fully functional.

Redundancy is typically implemented by using a laser to explode or evaporate conductors formed in the chip, and thereby physically disconnect the defective components and substitute the functional redundant components. However, this laser programmed redundancy technique is not cost-effective in the circumstance of a relatively small size contribution of the embedded DRAM to the SLIC. The cost of the laser and the testing equipment is significant, as is time and costs to program and apply the laser to the minute pattern of DRAM conductors and components on the chip. A standard SLIC test environment must be maintained to test the SLIC, because of the high relative proportion of non-DRAM components and to assure proper functionality of the SLIC itself. If the costs of laser programmed redundancy were added to the standard SLIC test processes, the resulting test procedure would not be standard and could possibly escalate the costs of fabrication to the point of making the entire SLIC process cost-ineffective.

These considerations are further complicated by the differing requirements for embedded DRAM for a variety of different SLICs.. Typically a SLIC manufacturer will have a "library" of standard component designs which can be incorporated together in creating the SLIC, because of the wide variety of different circuitry which may be required in different SLICs. The standard library designs will include, for example, arrays of logic gates, microprocessors, DRAMs and the like. The cost effectiveness of competing in the SLIC fabrication market depends on the ability to integrate the standard library designs together in creating the SLIC, without specifically having to redesign each component each time it is used in a different SLIC. Generally, successfully integrating different standard designs will require the ability to physically reposition the standard components on the chip to accommodate differing customer requirements. Furthermore, testing the SLIC is complicated by the different contributions and combinations of the standard designs, since a method must be devised to specifically test each component, even though the components may be combined in different patterns and relationships in different SLICs. Developing a unique test program for each different SLIC can also increase the overall costs of the SLIC.

Testing the SLIC is always accomplished initially after fabrication, and in addition, many SLICs also utilize a built in self test (BIST) to test the SLIC upon initially applying power. In general, the BIST program is executed to write a test pattern of signals to the DRAM array and thereafter to read the signals back from the DRAM array. The signals read from the array are compared with the signals which were written to the array, and the comparison reveals any defects in the DRAM. Each memory cell of the DRAM must be tested, and because a typical DRAM array has a large number of memory cells, BIST testing can occupy a considerable amount of time. While the BIST test occurs, the SLIC is not operational. BIST testing may delay the time when the SLIC becomes fully functional and able to respond in the environment in which it is intended to the used.

Substituting a redundant fully functional segment of a DRAM memory for a defective DRAM memory segment may also create difficulties in executing the operational software of the SLIC. The operational software maintains a memory map of the addresses of the functional memory, and these addresses are used by the software to achieve proper functionality. If a defective DRAM segment has one of the addresses in the range of the memory map, a memory remapper must be employed to translate the address signals generated by the operational software to the new address of the substituted redundant element. In general, memory remappers consume extra time to accomplish the address translation, and this extra time may degrade the performance of the SLIC. Thus, although redundancy may achieve a functional SLIC, the performance of the SLIC may suffer as a result of substituting those redundant elements which must be addressed during the normal functionality of the system software.

For all of the above reasons, and others, it is important to achieve high levels of performance from the DRAM embedded in SLICs and ICs, while using conventional SLIC manufacturing processes and redundancy techniques to fabricate the different types and configurations of SLICs. It is with respect to these and other considerations that the present invention has evolved.

SUMMARY OF THE INVENTION

An important improvement of the present invention relates to enhancing the capability to conduct a functional test on an embedded DRAM and to substitute functional redundant elements for defective elements. Another important improvement is to increase the speed at which the functional test and redundancy can be achieved. A further important improvement of the present invention is to establish a more simply executed BIST which accomplishes adequate testing despite its simplicity. Still another improvement relates to achieving redundancy in the DRAM portion of an SLIC on an electrical basis rather than on a physical basis, thereby avoiding the significant costs and difficulties associated with implementing conventional laser programmed and other physical redundancy techniques. A further improvement relates to achieving an electronic capability to reprogram the addresses of redundant elements substituted in the DRAM for defective elements. Still another improvement relates to electrically reprogramming the addresses of redundant addressable DRAM components to maintain a continuous memory map. Still another improvement relates to obtaining a continuous memory map and sequence of addresses when redundant elements are substituted, without using a memory remapper.

These and other improvements are implemented in a method of conducting a functional test on a memory array, preferably a DRAM memory array, formed by a plurality of embedded memory segments wherein each segment has a reprogrammable segment address. The method involves programming the same segment address into each segment and conducting a portion of the functional test while simultaneously addressing all of the segments at the same address. The method may also involve writing a test pattern of signals into the plurality of segments by using the same programmed address, programming unique addresses in place of the same addresses after writing the test pattern signals, and reading signals from each segment which were created by writing the test pattern signals by using the unique addresses. Further still, the method may include fabricating each segment with a reprogrammable segment address before reprogramming the segment address.

Additional preferable aspects of the method include writing the test pattern signals to substantially all memory locations within the segments, reading the signals created by the test pattern in parallel from a group of segments after reprogramming the segments to respond as a group, fabricating the memory array on a system level integrated circuit and executing the functional test as a BIST with an on-system processor, fabricating redundant segments and electrically substituting a redundant segment for a defective segment while conducting the functional test, reprogramming the address of the substituted redundant segment into a range of a continuous memory map and reprogramming the address of the defective memory segment out of the range of the continuous memory map, and electrically reconfiguring at least some of the operational components, such as word lines and bit blocks of one segment, to eliminate defective components while conducting the functional test.

As a result of using the same memory address, the test pattern of signals can be written more quickly, thus increasing the speed at which the functional test is conducted and the redundancy and reconfiguration is achieved. The functional test or BIST is more simply executed without requiring separate addresses to be used to write the test pattern, but the simplicity of addressing the test pattern signals to the segments nevertheless accomplishes adequate testing. Improvements in the speed of conducting the functional test are also achieved by reprogramming groups of segments to respond simultaneously and in parallel when reading out the test pattern signals. Redundancy and reconfiguration are achieved electrically as an aspect of the functional test, rather than on a physical basis. The addresses of the substituted redundant segments are maintained in a continuous memory map due to the reprogrammable nature of the segments, without using a memory remapper.

A more complete appreciation of the present invention and its scope can be obtained by reference to the accompanying drawings, which are briefly summarized below, to the following detailed description of presently preferred embodiments of the invention, and to the appended claims.

DETAILED DESCRIPTION

Figure 1:
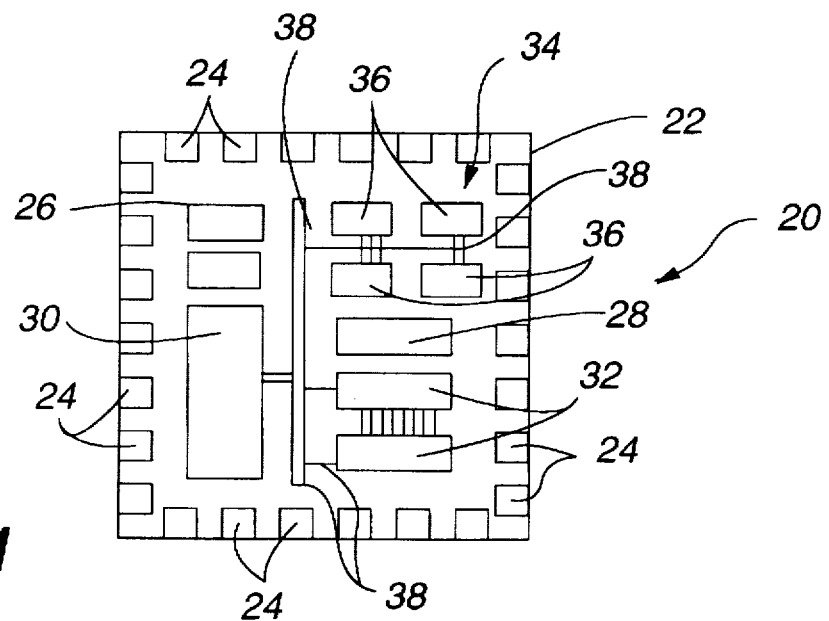
FIG. 1 is an overall layout illustration, not necessarily to scale or in proportion, illustrating a typical ASIC with an embedded DRAM array upon which the method of the present invention may be executed.

A system level integrated circuit (SLIC) 20 which incorporates the present invention is generally shown in illustrative, not-to-scale and not-to-proportion form in FIG. 1. Other than the present invention, the SLIC 20 is conventional. The SLIC 20 is formed as an integral unit on a die or chip 22. Pads 24 are formed on the exterior of the chip 22 by which to connect external electrical conductors (not shown), once the chip 22 has been packaged in a standard IC package (also not shown). The pads 24 are connected by internal conductors to the various functional components of the SLIC 20. The functional components of the SLIC 20 will vary according to the SLIC, but in general those components will include a processor 26, a read only memory (ROM) 28, logic arrays 30, and registers 32, for example, or other well known digital or analog components.

Included in the SLIC 20, or other IC, is an embedded dynamic random access memory (DRAM) array 34, which incorporates the present invention. The embedded DRAM array 34 is formed by a plurality of separate DRAM segments 36 which are interconnected by electrical conductors forming a bus 38 on the chip 22. The bus 38 also connects to many of the other components of the SLIC, including the processor 26. The bus 38 is of the standard configuration having a plurality of separate conductors which are generally located parallel to one another and over which control, address and data signals are transmitted between the various components 26, 28, 30, 32, and 36, etc. In general, the numbers, types and layouts or positions of the specific SLIC components on the chip 22 will vary according to each different SLIC.

Figure 2:
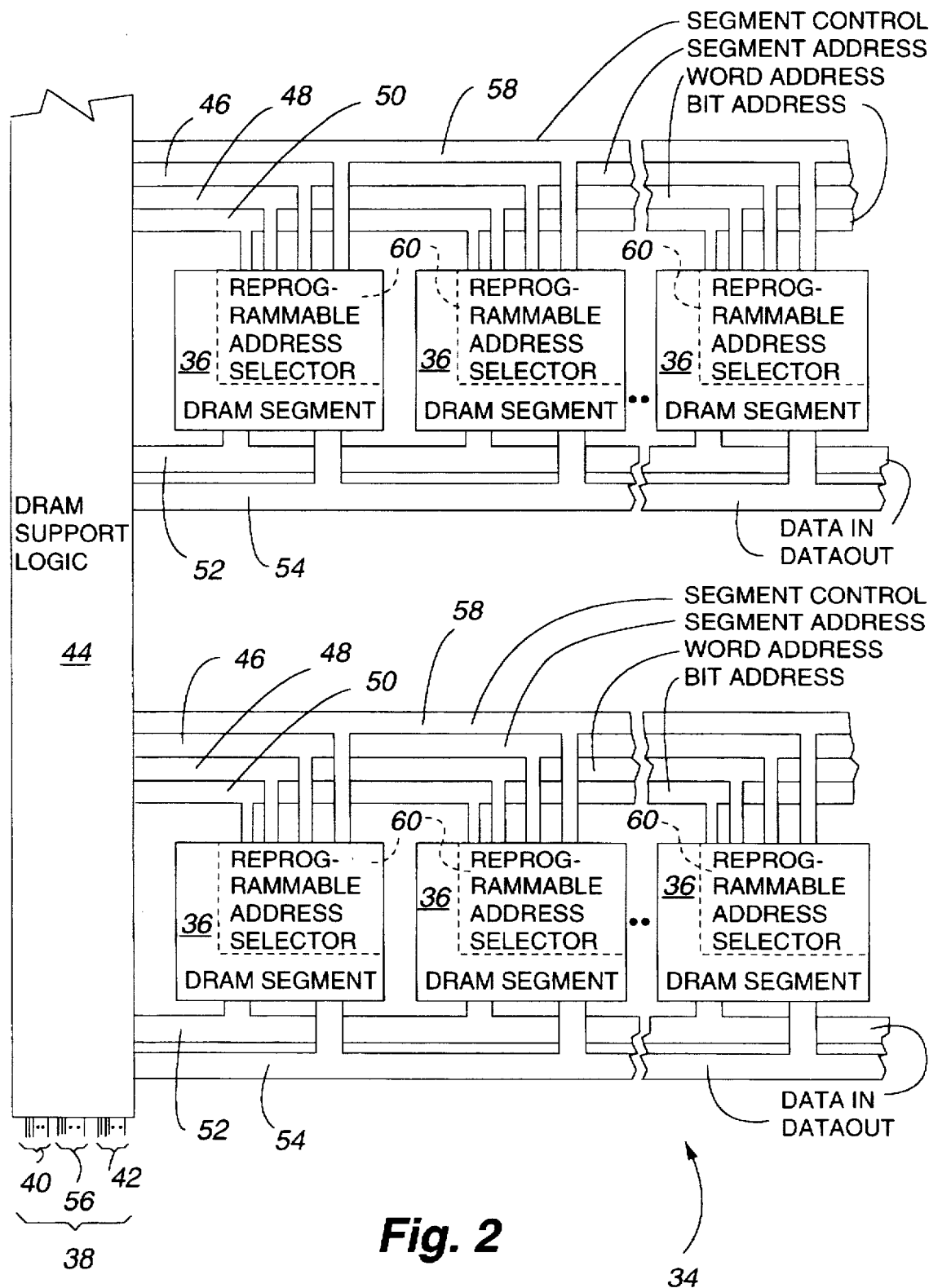
FIG. 2 is an enlarged block diagram of a portion of the embedded DRAM array shown in FIG. 1.

More details of embedded DRAM array 34 are shown in FIG. 2. The amount of embedded DRAM in the array 34 is generally established by replicating the number of individual DRAM segments 36 which constitute the array 34 until the desired size is achieved. For ease in SLIC fabrication, the DRAM segments 36 are designed as separate integral units of a specific memory size, for example, 64 Kbits arranged in 8 bit words. Although six separate DRAM segments 36 are shown in FIG. 2, it is not unreasonable to expect that some SLICs may require as much as 1–4 Mbits of memory, thereby requiring at least 16–64 separate 64 Kbit DRAM segments 36 to be reproduced. Of course, the position or layout of those DRAM segments 36 will usually vary from one SLIC chip to another, because the layout of each different SLIC chip is different. Thus, one of the benefits of the present invention is that it allows each DRAM segment 36 to be easily replicated, tested and reprogrammed as an independent unit and in a manner which is substantially independent of its position or location on the SLIC chip.

Each DRAM segment 36 is formed by a plurality of sub-parts referred to as bit blocks (not shown) which are described more completely in the previously mentioned Electrically Selectable Redundant Components patent application. The DRAM segments 36 and their constituent sub-part bit blocks generally have the conventional DRAM construction of a matrix-like configuration of individual DRAM cells (not shown) arranged in horizontal rows and vertical columns. The individual DRAM cells in specific rows within each DRAM segment 36 are interconnected in the conventional manner by word lines (not shown). The individual DRAM cells in the vertical columns within each DRAM segment 36 are interconnected in the conventional manner by bit lines (also not shown).

Each DRAM cell is intended to accept and hold information, in the form of a high or low electrical signal known as a "bit." The bit signal information is stored or "written" into each cell by sending a high or low signal to the particular cell. Information is recovered or "read" from the cell by accessing the cell and sensing the high or low state of the signal held by the cell. Individual cells are accessed by signals sent over the word lines and the bit lines. By uniquely selecting one word line and one bit line, the singular DRAM cell located at the intersection of selected word and bit lines is activated for writing or reading. By selecting one bit line in each DRAM segment 36, a "word" is formed by the bits of the selected memory cells within that DRAM segment 36.

Conventional word line and bit line decoders (not shown) of each DRAM segment 36 are connected to a group of conductors of the bus 38 which form an address bus 40. The word line and bit line decoders respond to predetermined address signals supplied on the address bus 40 to energize or activate those specific word line conductors and bit line conductors which correspond to the address signals. The activated word and bit line conductors access the memory cells of the DRAM segments 36 at the intersection of the activated word and bit line conductors to read and write the information. The information which is read from or written to the DRAM segments 36 is conducted over a group of conductors of the bus 38 which form a data bus 42.

The DRAM segments 36 are connected to and interface with the bus 38 through DRAM support logic 44. The DRAM support logic 44 includes the conventional devices typically used to maintain and sustain the operation of the DRAM array 34, such as data-in registers, data-out registers, address registers, refresh counters, data buffers and drivers. The DRAM support logic 44 also includes elements which separate the address signals applied on the address bus 40 into segment address signals which are applied on a segment-address bus 46, word address signals which are applied on a word address bus 48 and bit address signals which are applied on a bit address bus 50. In addition, the DRAM support logic 44 connects the data bus 42 to a data-in bus 52 and to a separate data-out bus 54. Another group of conductors of the bus 38, which form a control bus 56, are connected by the DRAM support logic 44 to a segment control bus 58. Control signals are supplied by the processor 26 (FIG. 1) over the control bus 56 to control the SLIC components, including the DRAM segments 36. The DRAM support logic 44 distributes the control signals from the control bus 56 to the segment control bus 58.

Each DRAM segment 36 is connected to the segment address bus 46, the word address bus 48, the bit address bus 50, the data-in bus 52, the data-out bus 54 and the segment control bus 58, for the purpose of communicating signals carried by those buses. The control signals on the segment control bus 58 are employed to control the operation of specifically addressed DRAM segments. Those DRAM segments 36 which are not addressed simply do not respond to the segment control signals. The same type of responsiveness applies with respect to the address signals. The address signals are broken into three groups by the DRAM support logic 44. Each DRAM segment 36 is individually selected or addressed by a group of address signals which constitute the segment address signals. The segment address signals are supplied on the segment address bus 46. Each DRAM segment 36 is activated in response to its unique segment address signal, and the remainder of the DRAM segments 36 in the array 34 do not respond.

Because the segment address signals are unique to each DRAM segment 36, the word line address signals and the bit line address signals are replicated for use by each of the DRAM segments. Confusion does not result because the word line and bit line address signals have no effect on those DRAM segments which have not been selected and activated by the unique DRAM segment address signals. Thus, each DRAM segment has the same series of word line and bit line addresses, but those addresses are distinguishable because of the unique segment address.

Figure 4:
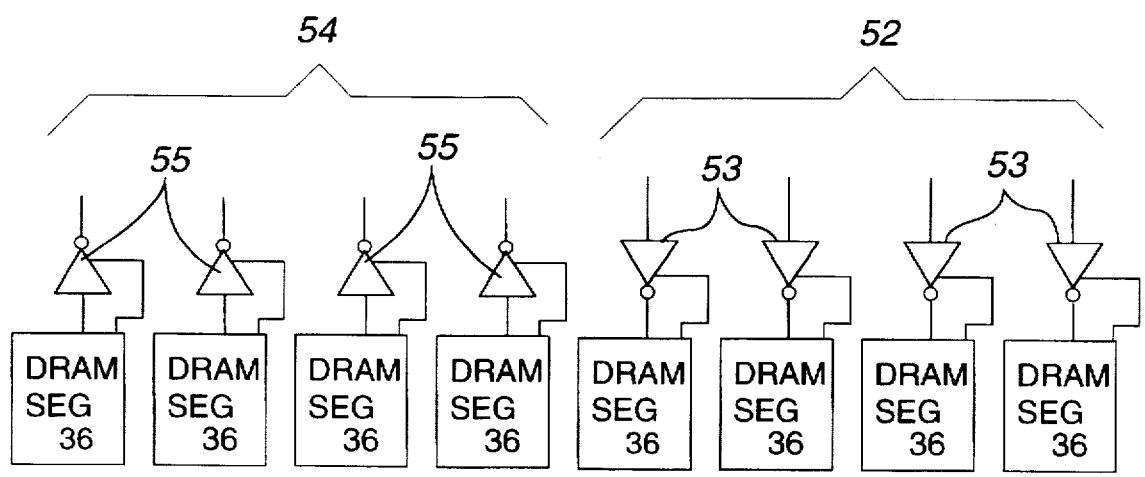
FIG. 4 is a schematic and block diagram of a portion of the DRAM array shown in FIG. 2.

The DRAM support logic 44 also separates the data to be written to and read from each DRAM segment 36. The data to be written to the DRAM segments is supplied over the data-in bus 52. Similarly, the data to be read from the DRAM segments is conducted over the data-out bus 54 to the DRAM support logic 44. When a specific DRAM segment 36 is addressed for a reading or a writing operation, the addressed DRAM segment accepts the signals from the data-in bus 52 in the write operation. Since each DRAM segment is uniquely addressed, the data available on the data-in bus 52 is only accepted by the uniquely addressed DRAM segment 36. However, as shown in FIG. 4, tri-state buffers 53 may optionally be included provide a high impedance on the data-in bus conductors 52 when the DRAM segment is not selected, although the input impedance to a DRAM segment is typically high and the tri-state buffers 53 are frequently not used. The tri-state buffers 53 are enabled for the write operation by a segment select signal (104, FIG. 3, described below) generated by the DRAM segment itself in response to segment address signals.

On the other hand, the bit lines from the DRAM segments to the data-out bus 54 usually include tri-state buffers 55. The impedance of the DRAM segment during data-out read operations is usually low, and without the tri-state buffers 55, the collective impedance of all of the DRAM segments attached to the data-out bus would substantially diminish the strength of the signals supplied during read operations. The tri-state buffers 55 are enabled by the segment select signals to connect the bit lines of the DRAM segment to the data-out bus 54.

The width of the data words supplied on the data bus 42 may be varied according to the requirements of the SLIC. For example, one of the upper (as shown) DRAM segments 36 may supply the first 8 bits of a 16 bit word on its data-out bus 52, while one of the lower (as shown) DRAM segments 36 may supply the other 8 bits of that 16 bit word on its data-out bus 52. The DRAM support logic 44 combines the two 8 bit words from the data-out buses 54, in this example, and formulates the resulting 16 bit word which it then applies to the data bus 42. The ability to combine words from individual DRAM segments is particularly useful in testing the array, as is described more completely below, because the output signals from a number of DRAM segments can be evaluated simultaneously in parallel rather than individually. A similar situation exists with respect to 16 bit data which is written to the DRAM array 34. The first 8 bits and the last 8 bits of the 16 bit word are separated by the DRAM support logic 44 and then separately sent to the upper and lower (as shown) DRAM segments.

The capability of each DRAM segment 36 to respond to the address signals supplied on the address buses 46, 48 and 50 is achieved by a reprogrammable address selector 60, in the present invention. The reprogrammable address selector 60 functions as an address decoder for the segment address signals supplied on the segment address bus 46 during normal operation of the DRAM array 34. However, the reprogrammable address selector 60 also achieves additional improvements that are applicable to achieving redundancy in the DRAM array 34 and in testing the DRAM array for proper operation, by electrically and selectively substituting a new logical address for the physical address established when the SLIC is fabricated. Substituting a new logical address causes the address decoding function of the DRAM segment to respond to addresses other than those which were originally and physically programmed during fabrication.

Although not specifically described herein, the utility of reprogrammable address selector 60 may also be applied to any addressable component such as the conventional word line and bit line decoders that are also present in the DRAM segments 36. By reprogramming the response addresses of the word line decoders and the bit line decoders in the same manner that the DRAM segment address is reprogrammed, the physical addresses of the word lines and the bit lines may be replaced electrically by selected logical addresses. Replacing the physical addresses of the word lines and the bit lines offers the advantages of maintaining the current and intended sequence of software addresses even when defective word lines and bit lines are replaced by redundant fully functional components that are not in physically sequential order.

Figure 3:
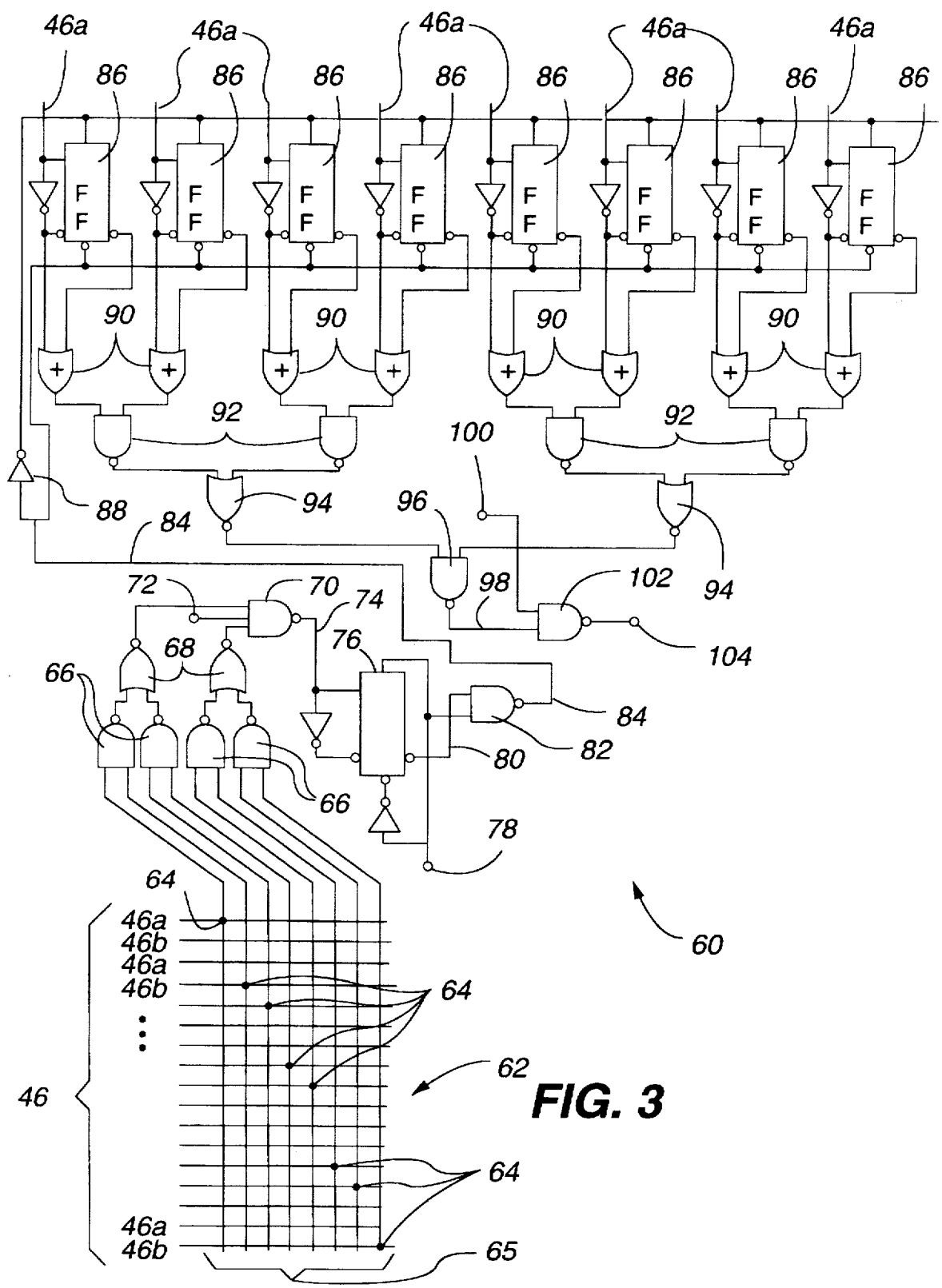
FIG. 3 is a schematic diagram of a reprogrammable address selector for each segment of the embedded DRAM array shown in FIG. 2.

The function of the reprogrammable address selector 60 in substituting a new logical address for the physical address is described below more completely in conjunction with FIG. 3. Each address decoder is fabricated with a physical address established by a matrix-like interconnect 62, formed by the conductors 46a and 46b of the segment address bus 46. The segment address bus conductors 46b carry the complements of the signals appearing on the conductors 46a. Connections 64 between the conductors 46a and 46b and conductors 65 connected to input terminals of NAND gates 66 are established during fabrication of the SLIC. The locations of the connections 64 relative to the conductors 46a, 46b and 65 in the interconnect matrix 62 establish the physical address for the associated DRAM segment 36. In the example shown in FIG. 3, the address shown by the connections 64 in the interconnect matrix 62 is 10101010. The physical addresses of the DRAM segments are assigned as part of the fabrication process when the connectors 64 are formed.

The physical address signals applied on the segment address bus 46 are applied through the connections 64 to the input terminals of the NAND gates 66. The output signals from the NAND gates 66 are applied to the input terminals of NOR gates 68, and output signals of the NOR gates 68 are applied as two input signals to a NAND gate 70. A reprogram enable signal 72 is supplied as a third signal to one input terminal of the NAND gate 70. The reprogram enable signal at 72 is asserted to enable a response to the physical address signals on the address bus 46. When the reprogram enable 72 and the signals from the NOR gates 68 are high, indicating that the address signals on the segment address bus 46 is the physical address assigned by the connections 64 in the matrix 62, the NAND gate 70 generates an output signal at 74. Normally the signal at 74 would constitute the DRAM segment select signal. However, the reprogrammable address selector 60 allows a different logical address to be substituted for the physical address, and thus the DRAM segment select signal will result when the logical address is received. The remainder of the circuitry shown in FIG. 3 accomplishes the substitution of the logical address for the physical address.

Reprogramming starts by generating the physical address signals on the segment address bus 46 during one address bus clock cycle, as described above. The reprogram enable signal 72 is also applied during this one address bus clock cycle. The presence of the physical address signals and the reprogram enable signal 72 during the first bus cycle causes the assertion of the signal at 74, which is applied to the D and not D input terminals of a flip flop (FF) 76. A clock signal at 78 is thereafter applied to the flip flop 76 to establish an output signal at 80 from the not Q output terminal of the flip flop 76. The clock signal at 78 and the output signal at 80 are applied to a NAND gate 82, and a logical output signal 84 results from the NAND gate 82. The delay effects from the flip flop 76 and the clock signal 80 cause the signal at 84 to be delayed by approximately one bus cycle compared to the application of the address signal on the address bus 46. The signal at 84 is therefore generated at approximately the same time that the next following or second bus clock cycle occurs.

In the next or second address bus clock cycle, the logical address signals to be substituted are placed on the address bus conductors 46a. The signals on the address bus conductors 46a are applied to the D and not D terminals of a plurality of register flip flops 86. The substitute address signals are set into the flip flops 86 by the effect of the true and complemented levels of the signal at 84, which, as just explained, occur during the same second bus cycle that the substitute logical address signals are supplied on the conductors 46a. The complement of the signal at 84 is developed by the inverter 88. Thus, the substitute logical address is recorded in the register flip flops 86 on the second bus cycle.

The output signals supplied from the not Q output terminals of the flip flops 86 are applied to a series of exclusive NOR gates 90. Output signals from the exclusive NOR gates 90 are applied to the input terminals of NAND gates 92, and the output signals from the NAND gates 92 are applied to the input terminals of NOR gates 94. Finally, the output signals from the NOR gates 94 are applied as input signals to a last NAND gate 96. These logic gates 90, 92, 94 and 96 decode the output signals from the flip flops 86. When the signals constituting new logical address are applied on the segment address bus conductors 46a, and those address signals agree with the address information stored in the register flip flops 86, represented by the signals from the not Q output terminals, a signal is present at 98 indicating that the DRAM segment has been addressed. The signal at 98 and the segment enable signal 100 are applied to the input terminals of a NAND gate 102. The coincident application of the signals 98 and 102 results in the creation of a segment select signal 104. The segment select signal 104 is used to select or activate the DRAM segment to accomplish its various functions, such as read, write and refresh.

Once the new logical address has been substituted, the reprogram enable signal 72 at one input terminal of the NAND gate 70 is de-asserted. The output signal from the NAND gate 70 disables any further response from the signals supplied by the interconnect matrix 62. So long as the reprogram enable signal 72 is not asserted after the new logical address has been programmed, the response of the selector 60 will be only to the new logical address. The reprogrammed substituted address is preserved for use during normal operation, and the reprogrammable address selector 60 will continue to respond only to the substituted logical address signals, not the originally programmed physical address signals. If it is desired to later reprogram the selector 60 to a different logical address, the above-described procedure is again followed, starting with the assertion of the reprogram enable signal at 72. If it is not necessary to change the address of the selector 60 from the originally programmed physical address, the logical address programmed is the same as the physical address.

When the reprogramming is employed to replace a defective DRAM segment 36 with a redundant fully functional DRAM segment, the logical address of the defective segment is changed to an address which falls outside of the range of the continuous memory map employed by the operational software of the SLIC. The substituted logical address outside of the operational memory map range assures that the defective DRAM segment will not respond to any address signals during normal operation, because only address signals within the range of the memory map will be generated by the operational software. Thus the defective bit block or DRAM segment is removed from operation. Thereafter, the redundant fully functional DRAM segment is reprogrammed with the logical address of the defective segment, at an address which is within the continuous range of the memory map. In this manner defective DRAM segments are eliminated and the fully functional redundant elements are substituted in their place and assigned addresses which fall within the range of the continuous memory map.

Continuous addresses in the memory map are necessary for proper software functionality. Removing a defective DRAM segment creates a gap or hole in the memory map. The typical method of avoiding the hole in the memory map is to utilize a memory remapper. A memory remapper is used to adjust or translate the addresses of the substituted redundant and disconnected defective DRAM segments during continuous execution of the operational software. A problem with such memory remappers is that they are limited in speed, making it difficult or impossible to execute the functional software at the higher clock rates prevalent in current digital logic SLICs. The present invention overcomes this problem by initially substituting a new logical address which falls in sequence in the memory map for the substituted redundant DRAM segment. The problems created by a hole in the memory map and the speed limitations of a memory mapper are simultaneously avoided.

Flash memory or another type of non-volatile memory could be employed in place of the register flip flops 86 (FIG. 3) in the reprogrammable address selector 60. Using non-volatile memory in this manner avoids the necessity to conduct a test each time that power is initially applied to the SLIC and to send the appropriate control signals to the register flip flops each time power is initially supplied. The non-volatile memory would retain the programmed logical address without the necessity for substituting the new logical address. Of course, the semiconductor fabrication process for SLIC must accept the fabrication process for the flash or other non-volatile memory elements as part of its overall application process.

One advantage of the reprogrammable address selector 60 is that it enables the selected DRAM segment in response to an address signal applied on the address bus, rather than to require a separate DRAM select signal and conductor to be routed throughout the SLIC for selection of each DRAM segment. Selecting one individual DRAM segment 36, or selecting a plurality of DRAM segments on a collective basis, refers to activating those selected DRAM segments for reading, writing and refreshing operations. Decoding the segment address signals inherently selects the associated DRAM segment.

Using the address bits as a basis for selecting individual or collective numbers of DRAM segments 36 has the advantage of eliminating numerous individual conductors which would consume space on the SLIC, if individual segment select lines had to be routed to each DRAM segment 36. This is particularly important when a large number of DRAM segments 36 are required on the SLIC. Another advantage of using the address selector 60 to select DRAM segments is that a universal select circuit can be employed in the DRAM array independently of the number of DRAM segments which are incorporated in the array, since each DRAM segment responds independently. Thus, the DRAM segment select functionality based on the address bits offers the improvement in embedded DRAMs of achieving a greater degree of universality, while conserving valuable space that would otherwise be consumed by individual conductors.

Another advantage of the reprogrammable address selector 60 is that it allows data of different word lengths to be generated, if different components of the SLIC require different word lengths. For example, some of the SLIC components may require 8 bit words, while others may use 16 bit words. In such a circumstance, the register flip flops 86 (FIG. 3) are dynamically reprogrammed during execution of the operational software. Thereafter, in response to the address signals, the DRAM segment(s) respond so that different length words can be formulated according to their addresses during execution of the operational software. For example, if 8 bit words are required, only one of the DRAM segments 36 (FIG. 3) will respond. However when 16 bit words are required, one upper and one lower (as shown in FIG. 2) DRAM segment will respond simultaneously, thereby creating the 16 bit word. Thus, the reprogrammable aspects of the address selector 60 allow it to be dynamically reprogrammed for use during the execution of the operational software, should that be necessary or desirable.

The capability to electrically and selectively substitute logical addresses also offers advantages when testing the SLIC and DRAM array 34. The ability to reprogram the segment addresses allows all of the DRAM segments 36 to be written with a test pattern of signals more quickly in response to a limited number of address signals, and then allows those test patterns to be read from the DRAM segments more quickly, again in response to a limited number of address signals. Compared to the conventional testing program where unique addresses must be generated for all of the memory cells to sequence the test pattern through each of the DRAM segments individually, the amount of time consumed by testing with reprogrammed segment address signals is reduced, because a lesser number of address signals must be generated.

Figure 5:
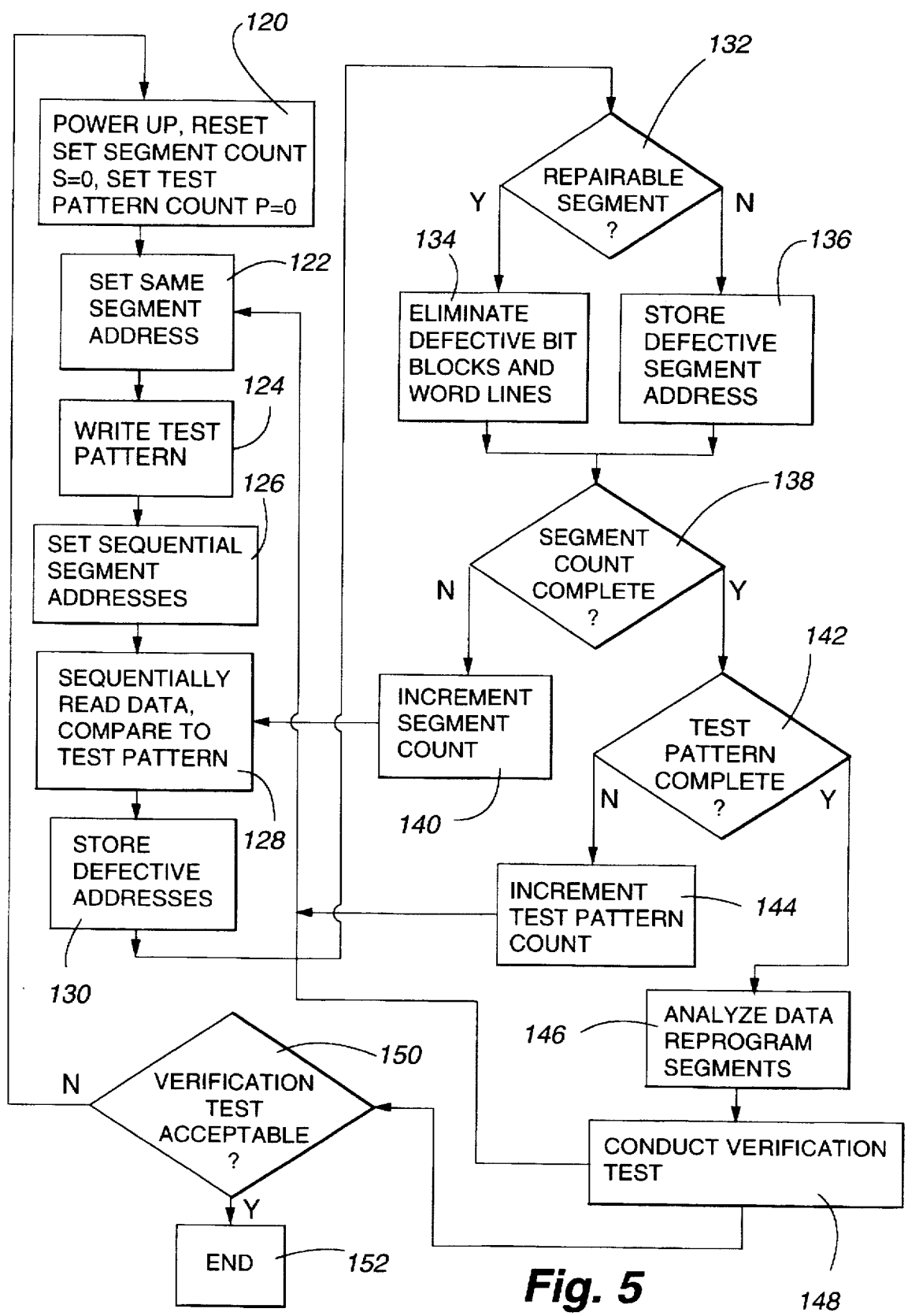
FIG. 5 is a flow chart of functions executed while conducting a functional test according to the present invention.

The testing to determine the functional components of the DRAM array will occur after fabrication, as a result of conducting a fabrication test program, or the testing may occur subsequently after the SLIC is placed in use, as a result of conducting a conventional built in self test (BIST). The testing procedure is shown in more detail in the flow chart shown in FIG. 5. The steps of the process shown in FIG. 5 are separately described as steps and identified by reference numbers for convenience of description.

The BIST or functional test commences at step 120, where power is initially applied to the ASIC. The functional elements, such as flip flops and the like, of the DRAM segments 36 of the array 34 are reset to their initial states. Two counters are also reset. One counter is used for counting the segments 36 of the array to make sure that all functional segments of the array have been tested. The other counter is used for counting the patterns of test signals which are applied to the DRAM segments. A normal test pattern may consist of approximately 14 separate and different test patterns which are written into and then read from the DRAM segments. Initializing the segment counter (S) and the test pattern counter (P) to a zero count to begin with completes the initialization step 120 of the functional test.

The functional test is conducted using the DRAM segments and DRAM components which are the original choices for use in the operational array. In other words, the initial test does not extend to the redundant segments. However, the initial test can be expanded to test all of the DRAM segments, including any redundant segments. Testing the redundant segments will also derive information concerning those segments as well as the others, and that information may be used in the same manner as is described below. However, the following description of the test procedure assumes that the initial number of DRAM segments tested are the original physical ones intended for use (not redundant segments) and that the test will extend only to the number of DRAM segments which are intended for functional use of the ASIC.

Step 122 involves setting the logical addresses of each DRAM segment to the same address. This step is accomplished by using the reprogrammable address selector 60 (FIG. 3) as described above to reprogram the physical segment addresses to the selected logical address to be used when the test pattern is written to the segments of the array. In the step 122, all of the segment addresses are set to the same logical address.

The first pattern test signals are thereafter written simultaneously to all of the DRAM segments, as shown at step 124. All of the DRAM segments may be written with the test pattern on a simultaneous basis because the logical segment response address of all segments is the same, as established at step 122. By setting the same logical segment response address in all the DRAM segments, the number of address signals to write the test pattern to the DRAM segments is greatly reduced. Without setting the logical response segment address to a single address, a separate set of address signals would have to be generated for each DRAM segment. Thus, by setting a single logical response address for all DRAM segments, the amount of time consumed by writing the test pattern is reduced by a percentage equal to approximately one divided by the number of DRAM segments. This factor itself results in a considerable savings in time when executing the functional test.

After the test pattern has been written into the DRAM segments at step 124, each of the DRAM segments is thereafter reprogrammed with a logical response address equal to its physical response address, as shown at step 126. Making the logical response address equal to the physical response address allows each of the original intended DRAM segments to be tested for defects, as explained above.

Thereafter, using the unique logical segment response address of each DRAM segment, the signals from each DRAM segment are read out, on a word line and bit line basis, as shown at step 128. The signals read from the DRAM segment are compared to the signals written from the test pattern at step 124. Any discrepancies between the signals read from the DRAM segment at step 128 and the test pattern signals indicates a possible malfunction and defect. Those word line and bit line addresses which result in discrepancies between the test signals and signals read from the DRAM segment are noted and stored in memory associated with the processor conducting the test for example the processor 26 shown in FIG. 1. The defective addresses are stored at step 130.

As an alternative to reprogramming unique logical response addresses in each DRAM segment and thereafter individually reading the signals created by the test pattern previously written from each DRAM segment one at a time, groups of DRAM segments may be reprogrammed to the same logical response addresses prior to reading the signals from DRAM segments. With a group of DRAM segments reprogrammed to the same address, the output signals from the group are collectively applied to different conductors of the data-out buses 54 (FIG. 2) in response to read addresses. Thus the output signals from the group of DRAM segments can be evaluated in parallel without requiring each DRAM segment to be addressed individually. This process assumes that the data-out bus conductors are distributed to different ones of each group of DRAM segments, so that the output signals from each DRAM segment will appear separately on individual bus conductors. This process also assumes that sufficient bus width is available to accommodate the signals from a group of DRAM segments simultaneously. Thus, the speed and efficiency in reading out the signals from the test patterns are increased, because the reprogramming capability of the DRAM segments allows the test signal information from groups of segments to be read simultaneously in parallel.

Based on the stored information of defective addresses, the test program executes conventional algorithms to determine whether the DRAM segment is repairable, as is shown at step 132. If the determination at step 132 indicates that the extent of the defects noted at step 130 will allow the defective bit blocks and word lines of the segment 36 to be repaired, preferably using the technique described in the previously mentioned Electrically Selectable Redundant Components patent application, the defective word lines and bit blocks are eliminated at step 134. If on the other hand, the determination at step 132 indicates that the DRAM segment tested can not be reconfigured into a fully functional unit because the location of the word line and bit block defects are so extensive or diverse, the address of the non-repairable DRAM segment is stored in memory at step 136. The DRAM segments whose addresses are stored at step 136 must be replaced by redundant DRAM segments, if the DRAM array is to be made functional.

After completing either step 134 or step 136, a determination is made at step 138 of whether the segment count (S) is complete. The segment count simply refers to whether all the DRAM segments of the array have been evaluated. Until all of the DRAM segments have been evaluated in the manner described at steps 130, 132, 134 and 136, the next segment address will be selected and incremented, as shown at step 140.

Incrementing the next segment address at 140 results in again executing steps 130, 132, 134, 136 and 138. The sequence of executing the steps 130, 132, 134, 136 and 138 continues until all of the DRAM segments 36 of the array 34 have been tested. When all of the segments have been tested, the determination at step 138 shifts the program flow to step 142.

Step 142 refers to determining whether all of the patterns of test signals have been written to the DRAM array. In the example described so far, only the first test pattern has been written and read from the DRAM segments. Since the functional test will normally include a plurality of different test patterns, the determination at step 142 assumes that all of the different test patterns have been used before the functional test is concluded.

Until all of the test patterns have been written and read from the DRAM segments, the determination at step 142 will result in incrementing the test pattern count, as shown at step 144. Upon incrementing the test pattern count, the program sequence returns to step 122. Thereafter, the sequence of the functional test previously described at steps 122, 124, 126, 128, 130, 132, 134, 136, 138 and 140 continues, with respect to the next test pattern of signals. Until all of the test patterns of signals have been written, read and the DRAM segments evaluated, the repeated flow through this sequence of steps 122–144 will continue.

At the conclusion of supplying all of the test patterns, the determination at step 142 will indicate that the test pattern generation is complete. The program flow will thereafter move to step 146, where the data gathered from all of the test patterns will be analyzed and redundant DRAM segments will be substituted for the defective DRAM segments identified at step 136. Substitution of the redundant DRAM segments is accomplished by reprogramming the segment address of the substituted redundant DRAM segment to a logical response address within the memory map. The segment address of the defective DRAM segment is reprogrammed to a logical response address outside of the range of the memory map.

Because the substituted redundant DRAM segment has not been tested, for the reasons noted above, the entire sequence beginning at step 122 and continuing through step 146 will again be conducted using the substituted redundant DRAM segments. This sequence is referred to as a verification test and is initiated from the step at 148. The steps 122 through 146 are again executed as the verification test, and the results of the verification test are evaluated at step 150. If the verification test reveals that a fully functional DRAM array has been established, the functional test ends at step 152. However, if as a result of the substitution of the redundant DRAM segment, the verification test indicates that DRAM segment is still not functional, the sequence returns to step 120. Returning the sequence flow to step 120 allows the test algorithm to determine whether other possibilities to salvage the DRAM array are available, such as by changing the manner in which the defective bit blocks and word lines have been eliminated at step 134 or by using different redundant DRAM segments to substitute for any defective DRAM segments. If no other alternatives are possible to salvage the DRAM array, the functional test indicates that the ASIC is defective.

Although not shown in FIG. 5, if more than one DRAM array 34 (FIG. 2) is used in the ASIC, the entire test procedure shown by the flow chart in FIG. 5 is repeated for each separate DRAM array. Also not shown in FIG. 5 are the conventional steps of conducting an addressing test to verify that the address components are not defective.

By utilizing the reprogrammable address selector 60 (FIGS. 2 and 3), the speed at which the functional test can be executed is greatly increased. The step 122 accomplishes a reduction in execution time and hence results in speeding the functional test. By being able to simultaneously write the test pattern to all of the DRAM segments, the time to generate separate addresses to each of the segments for writing the test pattern is saved. Writing the test pattern to each DRAM segment separately consumes a significant portion of the time required to execute previous functional tests. Similarly, the ability to read the signals from a group of DRAM segments in parallel also reduces the amount of time consumed by the functional test, since individual segments do not need to be individually addressed.

Another improvement available from the reprogrammable address selector is the capability to offer continual redundancy to avoid malfunctions arising from latent defects. Latent defects manifest themselves only after the SLIC has been placed in use. While a BIST may be run each time the power is initially applied to notify the user of subsequently developed defects, there was no known technique to replace latently defective DRAM segments which only reveal the defect after some period of use. However, with the reprogrammable address selector 60, the ability to eliminate defective DRAM segments by reprogramming the segment address is always present, provided that unused redundant DRAM segments are available as replacements. Such functionality can be achieved under the control of software at any time after the SLIC has been manufactured. Furthermore, the reprogramming is accomplished electrically under control of the SLIC operating software and the defect testing software.

Presently preferred embodiments of the invention and their improvements and advantages have been described. This description has been made by way of preferred example rather than as a restriction on the invention. The scope of the present invention is defined by the scope of the following claims, and not necessarily by the detailed description of the preferred embodiment set forth above.

The invention claimed is:

1. A method of conducting a functional test on an array of a plurality of embedded memory segments wherein each segment includes a reprogrammable segment address selector which is connected to a common segment address bus over which segment address signals are supplied, comprising the steps of:

temporarily programming each reprogrammable segment address selector to respond to the same segment address signal and to enable the memory segment within which the reprogrammable segment address selector is included;

applying the same segment address signal to the segment address bus and to all of the reprogrammable segment address selectors after each reprogrammable address selector has been programmed to respond to the same segment address signal; and conducting a portion of the functional test after the reprogrammable address selectors have been temporarily programmed and while simultaneously applying the same address signal on the address bus to all of the reprogrammable segment address selectors of all of the segments.

2. A method as defined in claim 1 further comprising the step of:

writing a test pattern of signals into the segments while the segments have the same address.

3. A method as defined in claim 2 further comprising the step of:

writing test pattern signals to substantially all memory locations within the segments.

4. A method of conducting a functional test on an array of a plurality of embedded memory segments wherein each segment has a reprogrammable segment address, comprising the steps of:

programming the same segment address into each segment;

conducting a portion of the functional test while simultaneously addressing all of the segments with the same address; and reprogramming the segment address of each segment to a unique segment address during another portion of the functional test.

5. A method as defined in claim 4 further comprising the steps of:

writing a test pattern of signals into the segments while the segments have the same address; and reading signals from the segments created by the test pattern signals using the unique segment addresses.

6. A method as defined in claim 4 further comprising the steps of:

reprogramming the segment addresses of a group of segments to the same segment address during another portion of the functional test; and reading signals created by the test pattern signals in parallel from the group of segments by addressing the segments as a group using the same segment address.

7. A method of conducting a functional test on an array of a plurality of embedded memory segments wherein each segment has a reprogrammable segment address, comprising the steps of:

programming the same segment address into each segment;

conducting a portion of the functional test while simultaneously addressing all of the segments with the same address; and fabricating each segment with a reprogrammable segment addressing capability prior to conducting the functional test.

8. A method as defined in claim 7 further comprising the steps of:

fabricating the memory segment array on a system level integrated circuit which also contains a processor and a ROM having instructions for executing the functional test prior to conducting the functional test; and executing the functional test instructions from the processor.

9. A method as defined in claim 8 wherein each segment is a DRAM.

10. A method as defined in claim 7 further comprising the step of:

fabricating at least one redundant memory segment prior to conducting the functional test.

11. A method as defined in claim 10 further comprising the step of:

electrically substituting the redundant memory segment for a defective memory segment while conducting the functional test.

12. A method as defined in claim 11 further comprising the steps of:

reprogramming the segment address of the substituted memory segment into a range of a continuous memory map; and reprogramming the segment address of the defective memory segment out of the range of the continuous memory map.

13. A method as defined in claim 7 further comprising the step of:

fabricating at least one memory segment with reconfigurable components prior to conducting the functional test.

14. A method as defined in claim 13 further comprising the step of:

electrically reconfiguring one of the reconfigurable components of a memory segment to eliminate a defective component while conducting the functional test.

15. A method as defined in claim 14 wherein the reconfigurable component is one of a bit block or a group of word lines.

16. A method of conducting a functional test of an embedded array formed by a plurality of DRAM segments which each have reprogrammable addresses, comprising the steps of:

programming the same segment addresses into the segments;

writing a test pattern of signals into the plurality of segments by using the same programmed address;

programming unique segment addresses in place of the same segment addresses in the plurality of segments after writing the test pattern signals; and reading signals from each segment of the plurality which were created by writing the test pattern signals while using the programmed unique addresses.

17. A method as defined in claim 16 further comprising the step of:

writing the test pattern signals to fill substantially all memory cells of the DRAM segment.

18. A method as defined in claim 16 further comprising the step of:

electrically substituting at least one redundant memory segment for another memory segment while conducting the functional test.

19. A method of conducting a functional test on a plurality of segments of an embedded memory array, comprising the steps of:

fabricating each DRAM segment with a reprogrammable segment address;

programming the segment addresses to a singular address; and writing test signals to substantially all memory locations of a plurality of the segments using the singular programmed address.

20. A method as defined in claim 19 further comprising the step of:

programming each segment with a unique segment address after writing the test signals.

21. A method as defined in claim 19 further comprising the step of:

fabricating at least one redundant memory segment prior to conducting the functional test.

22. A method as defined in claim 21 further comprising the step of:

electrically substituting the redundant memory segment for a defective memory segment while conducting the functional test.

* * * * *